US008774346B2

(12) United States Patent
Son

(10) Patent No.: US 8,774,346 B2
(45) Date of Patent: Jul. 8, 2014

(54) SHIFT REGISTER AND DRIVING CIRCUIT USING THE SAME

(75) Inventor: Ki Min Son, Gyeonggi-do (KR)

(73) Assignee: Hydis Technologies Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/597,312

(22) Filed: Aug. 29, 2012

(65) Prior Publication Data

US 2013/0077736 A1 Mar. 28, 2013

(30) Foreign Application Priority Data

Sep. 23, 2011 (KR) ........................ 10 2011 0096179

(51) Int. Cl.
*G11C 19/00* (2006.01)

(52) U.S. Cl.
USPC .................... 377/64; 377/69; 377/78; 377/79

(58) Field of Classification Search
None
See application file for complete search history.

(56) References Cited

U.S. PATENT DOCUMENTS

| | | | | |
|---|---|---|---|---|
| 7,106,292 | B2 | 9/2006 | Moon | |
| 7,949,086 | B2 * | 5/2011 | Tsai et al. | 377/64 |
| 8,089,446 | B2 | 1/2012 | Pak et al. | |
| 8,107,586 | B2 * | 1/2012 | Shin et al. | 377/64 |
| 8,165,262 | B2 * | 4/2012 | Lai | 377/64 |
| 8,199,870 | B2 * | 6/2012 | Shang et al. | 377/64 |
| 8,422,621 | B2 * | 4/2013 | Jang et al. | 377/64 |
| 8,558,601 | B2 * | 10/2013 | Jang et al. | 327/295 |
| 2006/0146978 | A1 * | 7/2006 | Jang | 377/64 |
| 2006/0256066 | A1 | 11/2006 | Moon | |
| 2008/0101529 | A1 * | 5/2008 | Tobita | 377/64 |
| 2008/0219401 | A1 * | 9/2008 | Tobita | 377/79 |
| 2009/0058790 | A1 * | 3/2009 | Chiang et al. | 345/100 |
| 2012/0269316 | A1 * | 10/2012 | Jang et al. | 377/75 |
| 2013/0070891 | A1 * | 3/2013 | Tsai et al. | 377/64 |
| 2013/0243150 | A1 * | 9/2013 | Jang et al. | 377/64 |

OTHER PUBLICATIONS

Abstract of Korean Patent—KR1020030095467, Dec. 24, 2003, 1 page.
Abstract of Korean Patent—KR20100116098, Oct. 29, 2010, 1 page.

* cited by examiner

*Primary Examiner* — Tuan T Lam
(74) *Attorney, Agent, or Firm* — Dority & Manning, P.A.

(57) ABSTRACT

Disclosed are a shift register that shows excellent operation reliability with elements less than those of the conventional structure and a gate driving circuit using the shift register. The gate driving circuit comprises each of a plurality of shift registers sequentially connected and respectively supplying scan signals to a plurality of gate lines of a display device.

17 Claims, 12 Drawing Sheets

(a)

(b)

Prior Art

Prior Art (a)

REPLACEMENT SHEET

SHIFT REGISTER AND DRIVING CIRCUIT USING THE SAME

CROSS-REFERENCE TO RELATED APPLICATION

This application claims priority to and the benefit of Korean Patent Application No. 10-2011-0096179 filed in the Korean Intellectual Property Office on Sep. 23, 2011, the entire contents of which are incorporated herein by reference.

BACKGROUND OF THE INVENTION (a) Field of the Invention

The present invention relates to a shift register and a gate driving circuit of a display device using the same, and more particularly, to a shift register, which can adjust a scan direction when a screen of a display device is upside down, and a gate driving circuit of the display device using the same.

(b) Description of the Related Art

Occasionally, a display device that has recently been used in a portable terminal may display images on a screen as it is reversed up and down or left and right in accordance with a user's intention. For these cases, a gate driving circuits of the display device need to be designed to change a scan direction.

A conventional shift register includes a plurality of thin film transistors (TFT) as disclosed in Korean Patent No. 10-1020627.

FIG. 1 is a block diagram of a gate driving circuit, showing connection among the conventional shift registers capable of adjusting the scan direction. FIG. 2 is a view of illustrating an example of the conventional shift register shown as a block in FIG. 1.

Referring to FIG. 2, the conventional shift register includes an input unit 10 for receiving an input signal for a shifting operation, an inverter unit 20 and a reset unit 30 for improving at its off-characteristics in an output terminal, and an output unit 40 for outputting a scan signal to a corresponding gate line.

In the conventional shift register, the inverter unit 20 is basically consisted of a TFT T5 and a TFT T9. The TFT T5 constantly keeps turned on by a bias voltage Vbias, and the TFT T9 is biased by voltage difference between VGL and LVGL since voltage applied to a source of the TFT T9 is a voltage of LVGL. Thus, even if the TFT T9 is turned on, an X node cannot be entirely dropped into the voltage of LVGL. Further, even when the TFT T9 is turned off, the X node cannot be increased up to the bias voltage Vbias. Therefore, the X node cannot be fully inverted.

To compensate for insufficient driving performance for the TFTs and secure reliability, a conventional inverter further need to include two TFTs T6 and T8 in addition to the TFTs T5 and T9. Thus, the conventional inverter includes all four of TFTs, and adds an LVGL signal to improve the reliability. Like this, such a conventional shift register needs a plurality of thin film transistors and signal lines to improve the off-characteristics. This causes problems of enlarging a dead space of a display device, resulting in the display having bigger size than originally planned and modifying a structure of the gate driving circuit.

Further, a shift register of a recent gate driving circuit has an additional function to change the order of applying signals to gate lines depending on rotation of a display screen. To this end, as shown in FIGS. 1 and 2, the conventional shift register needs a scan direction adjuster 50 including four thin film transistors Tb, Tbr, Tf and Tfr. Like this, as the number of transistors increases in order to change the order of applying the signals to the gate lines, the foregoing problems become serious to the conventional shift register.

BIBLIOGRAPHY OF RELATED ART

Korean Patent No. 10-1020627 (Mar. 2, 2011)

Korean Patent Publication No. 10-2007-0037793 (Apr. 9, 2007)

Korean Patent No. 10-0698239 (Mar. 15, 2007)

Japanese Patent No. 4391107 (Oct. 16, 2009)

SUMMARY OF THE INVENTION

Accordingly, the present invention is conceived to solve the forgoing problems, and an aspect of the present invention is to provide a shift register and a gate driving circuit that show excellent operation reliability with elements less than those of the conventional structure.

Another aspect is to provide a shift register and a gate driving circuit using the same having an improved input unit as compared with that of the conventional structure and enabling a bidirectional scan.

The foregoing and other aspects of the invention may be achieved by a shift register and a gate driving circuit using the same according to an exemplary embodiment.

According to an exemplary embodiment, there is provided a gate driving circuit comprising a plurality of shift registers sequentially connected to each other and respectively supplied scan signals to a plurality of gate lines of a display device, each shift register including: an input unit which outputs a forward or backward input signal as a direction control signal to a first node by an output signal from a previous or subsequent shift register of the shift register; an inverter unit which connects with the first node, generates an inverting signal for a signal of the first node and outputs the inverting signal to a second node; an output unit which includes a pull-up unit connecting to the first node, for activating a first clock signal by the signal of the first node and outputting the first clock signal as an output signal to corresponding gate line, and a pull-down unit for activating and outputting a pull-down output signal by a signal of the second node; and a reset unit which periodically resets the first node by a second clock signal, wherein the inverter unit is controlled by the second clock signal.

According to another exemplary embodiment, there is provided a shift register including a first switching device which includes a gate terminal connected to an output terminal of a previous shift register ((generally an (N−1)th or (N−2)th shift register), a drain terminal to receive a forward or backward input signal, and a source terminal connected to a first node; a second switching device which includes a gate terminal connected to an output terminal of a subsequent shift register ((generally an (N+1)th or (N+2)th shift register), a drain terminal to receive a forward or backward input signal, and a source terminal connected to a first node; a third switching device which includes a gate terminal connected to the first node, a drain terminal to receive a first clock signal, and a source terminal connected to the first node and corresponding gate line(generally a Nth shift register); a fourth switching device which includes a gate terminal connected to a second node, a drain terminal connected to the first node, and a source terminal connected to a low level voltage terminal; a fifth switching device which includes a gate terminal connected to the gate terminal of the third switching device and the second node, a drain terminal connected to the first node, and a source terminal connected to the low level voltage terminal; a sixth switching device which includes a gate terminal to receive a second clock signal, a drain terminal to receive a bias voltage, and a source terminal connected to the second node; a seventh switching device which includes a gate terminal connected to the first node, a drain terminal connected to the second node and the source terminal of the sixth switching device, and a source terminal connected to the low level voltage terminal; and an eighth switching device which includes a gate terminal to receive the second clock signal, a drain connected to the first node, and a source terminal connected to the low level voltage terminal.

According to still another exemplary embodiment, there is provided a gate driving circuit comprising a plurality of shift registers sequentially connected and respectively supplying scan signals to a plurality of gate lines of a display device, each shift register including: an input unit which receives an output signal from a previous shift register of the shift register, and outputs the output signal to a first node; an inverter unit which connects with the first node, generates an inverting signal for a signal of the first node, and outputs the inverting signal to a second node; an output unit which includes a pull-up unit for activating a first clock signal by the signal of the first node and outputting the first clock signal as an output signal to the corresponding gate line, and a pull-down unit for activating and outputting a pull-down output signal to the corresponding gate line by a signal of the second node; and a reset unit which periodically resets the first node by a second clock signal.

The inverter unit and the reset unit may be controlled by the second clock signal.

Also, a input signal to an input unit of the first or last shift register among the plurality of shift registers is a pulse type input start signal (STV).

According to still another exemplary embodiment, there is provided a shift register including a first switching device which includes a gate terminal and drain terminal connected in common to an output terminal of a previous shift register, and a source terminal connected to a first node; a second switching device which includes a gate terminal connected to the first node, a drain terminal to receive a first clock signal, and a source terminal connected to the first node; a third switching device which includes a gate terminal connected to a second node, a drain terminal connected to the first node, and a source terminal connected to a low level voltage terminal; a fourth switching device which includes a gate terminal connected to the gate terminal of the third switching device and the second node, a drain terminal connected to the first node, and a source terminal connected to the low level voltage terminal; a fifth switching device which includes a gate terminal to receive a second clock signal, a drain terminal to receive a high level voltage, and a source terminal connected to the second node; a sixth switching device which includes a gate terminal connected to the first node, a drain terminal connected to the second node and the source terminal of the fifth switching device, and a source terminal connected to the low level voltage terminal; and a seventh switching device which includes a gate terminal to receive the second clock signal, a drain terminal connected to the first node, and a source terminal connected to the low level voltage terminal.

BRIEF DESCRIPTION OF THE DRAWINGS

The above and/or other aspects of the present invention will become apparent and more readily appreciated from the following description of the exemplary embodiments, taken in conjunction with the accompanying drawings, in which.

DETAILED DESCRIPTION OF THE EMBODIMENTS

A display driving circuit, in which a gate driving circuit including a plurality of shifter registers for shifting and outputting an input signal is embedded on a display panel.

The display panel is divided into a display region and a non-display region. Specifically, the shift register is formed on the non-display region.

Further, when gate driving circuits employing the shift registers of the invention are disposed on both side of the display panel and respectively drive odd-numbered gate lines and even numbered gate lines, this is called a dual type arrangement of gate driving circuit. On the other hand, when one or more gate driving circuits are disposed on one-side of the display panel and drive the gate lines, this is called a single type arrangement of gate driving circuit.

Hereinafter, a shift register according to an exemplary embodiment of the invention will be described with reference to the accompanying drawings.

Figure 3:
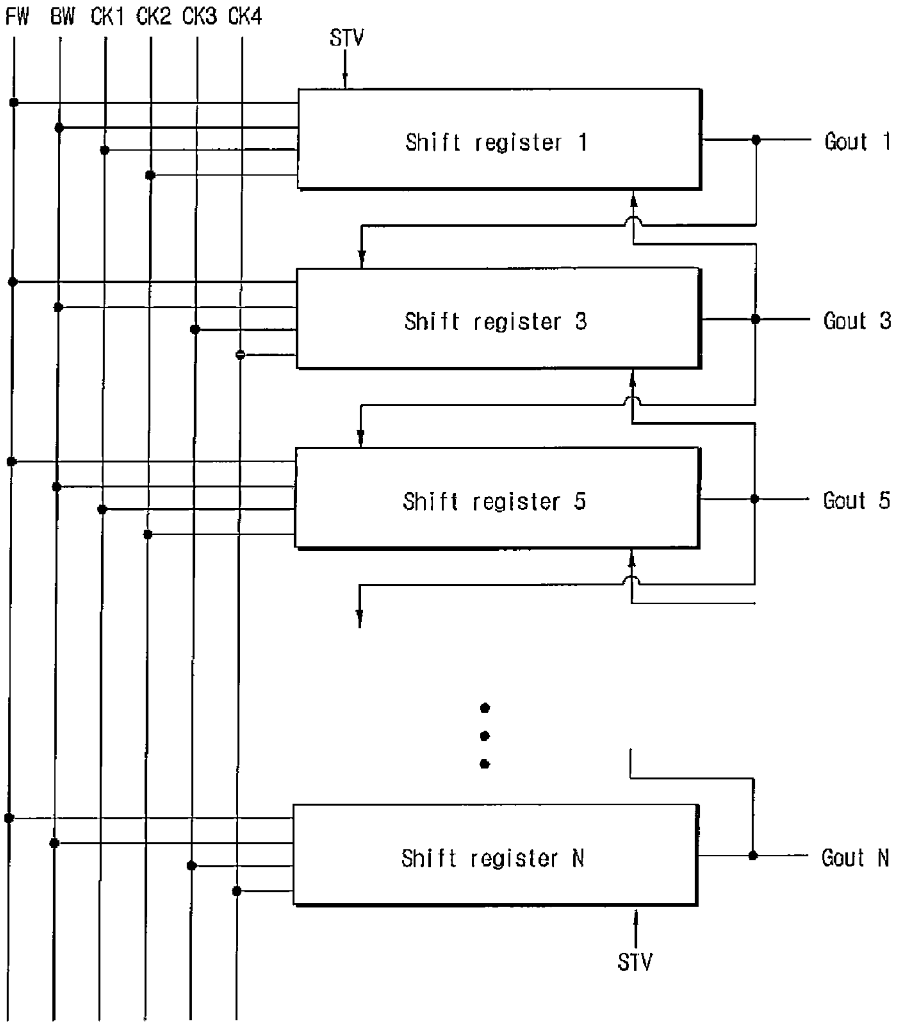
FIG. 3 is a block diagram of a gate driving circuit employing a shift register according to an exemplary embodiment of the invention.

FIG. 3 is a block diagram of a gate driving circuit employing a shift register according to an exemplary embodiment of the invention.

FIG. 3 shows the dual type where the gate driving circuits are arranged in left and right sides of the display panel and respectively drive the odd-numbered gate lines and the even-numbered gate lines.

If one gate driving circuit in left can drives the odd-numbered gate lines in order of 1, 3, 5. . . , the other gate driving circuit in right can drives the even-numbered gate lines in order of 2, 4, 6. . . . FIG. 3 shows a configuration of the gate driving circuit for driving the odd-numbered gate lines.

As shown in FIG. 3, one shift register becomes a unit device for the gate driving circuit. The gate driving circuit of FIG. 3 has a structure that plural unit devices are connected to each other in sequence for scanning corresponding gate lines to display video signals. Each shift register as the unit device uses two clock signals. For example, if the odd-numbered shift register uses a clock signal CLK1 as an output signal, and a clock signal CLK2 as a reset signal. The even-numbered shift register uses a clock signal CLK3 as an output signal, and a clock signal CLK4 as a reset signal. Also, a forward input signal FW activated by an output signal from a previous or subsequent shift register or STV (start pulse vertical) signal and a backward input signal BW activated by an output signal from a previous or subsequent shift register or STV (start pulse vertical) signal are sequentially applied to each shift register.

Figure 1:
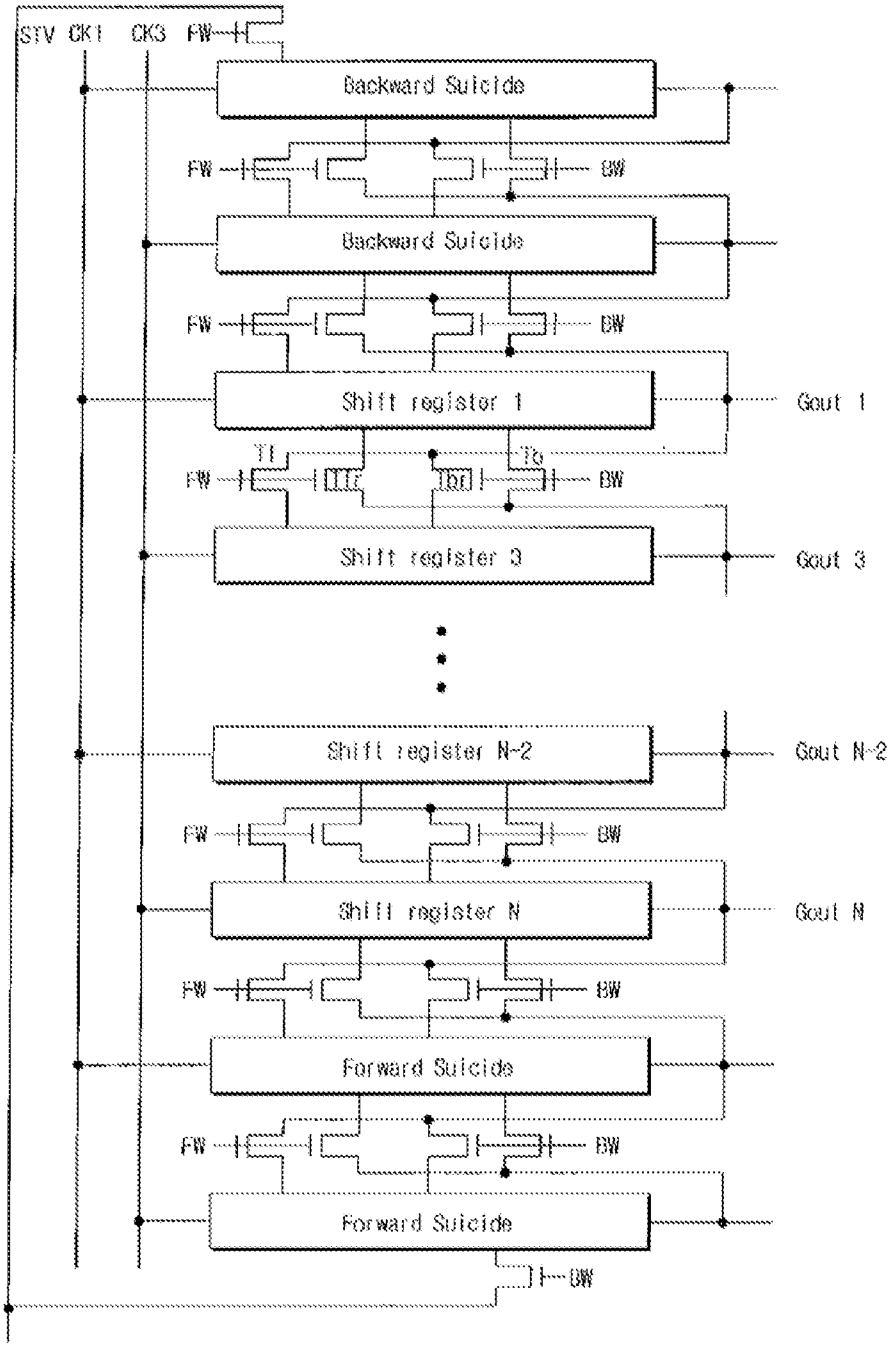
FIG. 1 is a block diagram showing relationship between the conventional shift registers capable of adjusting the scan direction.
Figure 2:
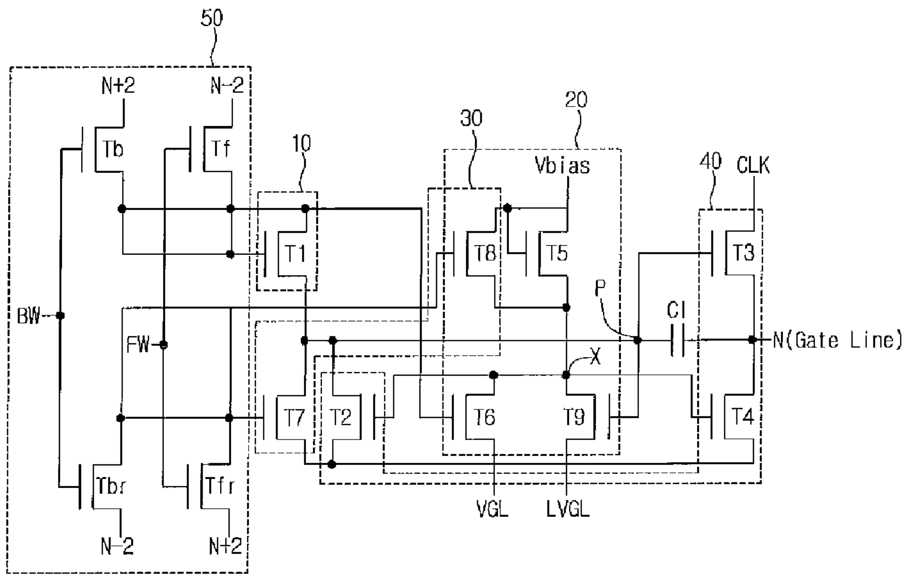
FIG. 2 is a detailed circuit diagram illustrating an example of the conventional shift register.

Referring to FIG. 3, the gate driving circuit in this exemplary embodiment uses the clock signal for the reset, so that a conventional TFT needed for the reset can be removed. The gate driving circuit of FIG. 3 uses the clock signal for the reset, and thus there is no need of a suicide dummy shift register for resetting the last shift register of FIG. 1. Accordingly, the suicide dummy shift register can be removed, so that a panel can be designed with a more space to spare than the conventional panel.

Figure 4:
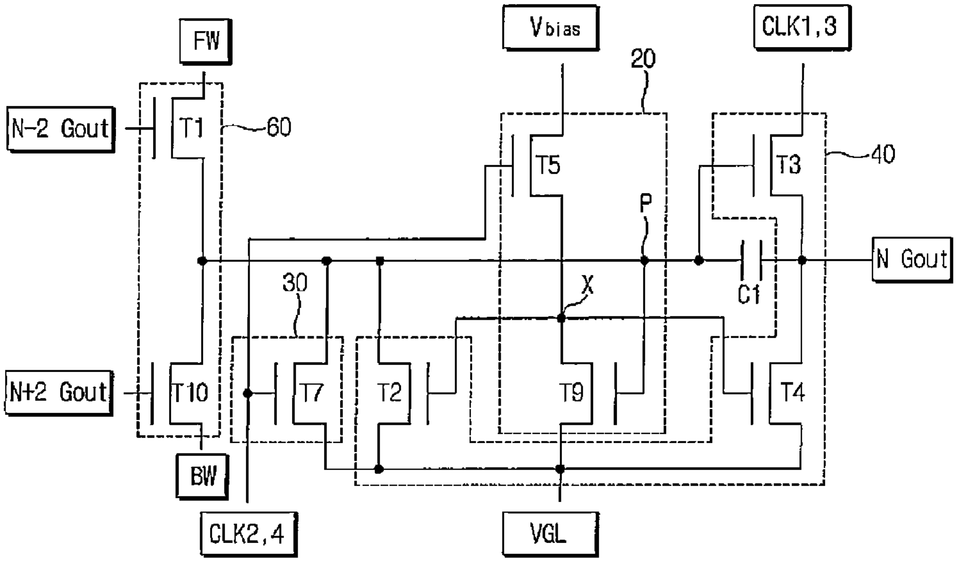
FIG. 4 is a detailed circuit diagram of the shift register of the invention shown in FIG. 3.
Figure 4:
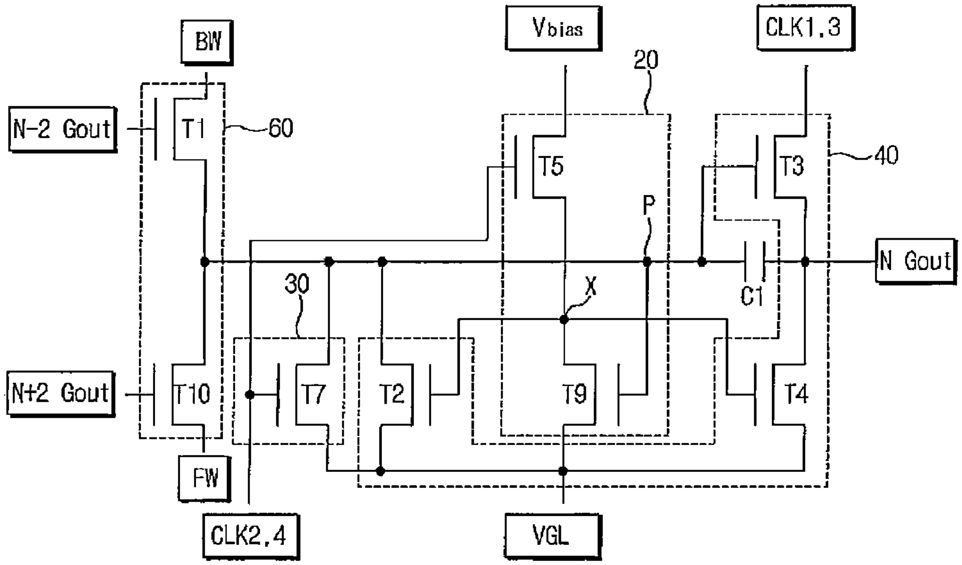

FIG. 4 is a detailed circuit diagram of the shift register according to an exemplary embodiment of the invention. FIG. 4(*a*) is a detailed circuit diagram of the shift register in the case of the forward driving and FIG. 4(*b*) is a detailed circuit diagram of the shift register in the case of the backward driving.

The shift register in this exemplary embodiment of the invention performs bidirectional driving, i.e., the shift register can perform forward and reverse direction scans. The shift register includes an input unit 60, an inverter unit 20, a reset unit 30 and an output unit 40.

The input unit 60 receives a forward input signal FW having a gate high voltage VGH or a backward input signal BW having a gate low voltage VGL based on an output signal of a previous or subsequent shift register. The input unit 60 transmits an output signal to a P node (also called a 'bootstrap node') connecting with an output terminal N Gout. As compared with the conventional structure of FIG. 1, the present exemplary embodiment of the invention removes four TFTs added for direction control and has a structure that is added only one TFT to the input unit 60. Thus, the input unit 60 has a simple circuit configuration.

In the case of the dual type where the gate driving circuits are arranged in left and right opposite sides of the display panel and respectively drive the odd-numbered gate lines and the even-numbered gate lines, the output signal of the anterior shift register is an (N−2)th output signal N−2 Gout in the nth gate driving circuit by way of example. On the other hand, if the output signal of the posterior shift register is an (N+2)th output signal N+2 Gout in the nth gate driving circuit by way of example. In contrast to the dual type, in the case of the single type where the gate driving circuit is arranged in only one side of the display panel, the output signal of the anterior shift register is an (N−1)th output signal N−1 Gout in the nth gate driving circuit by way of example. On the other hand, if the output signal of the posterior shift register is an (N+1)th output signal N+1 Gout in the nth gate driving circuit by way of example.

The input unit 60 includes TFTs T1 and T10. The TFT T1 has a gate terminal connected to an output terminal of the previous shift register, a drain terminal receiving a directional input signal (e.g., a forward input signal FW in the case of the forward driving), and a source terminal connected to the P node. The TFT T10 has a gate terminal connected to an output terminal of the subsequent shift register, a drain terminal receiving a directional input signal (e.g., a backward input signal BW in the case of the forward driving), and a source terminal connected to the P node.

Thus, the input unit 60 changes the signal applied to the drain terminal of each transistor T1 or T10 into the forward input signal FW or the backward input signal BW in accordance with the scan direction.

The inverter unit 20 is connected to the P node. The inverter unit 20 is driven by the second clock signals CLK2 or CLK4 to generate an inverting signal for the signal of the P node and output it to an X node.

The inverter unit 20 includes TFTs T5 and T9. The TFT T5 has a gate terminal receiving the second clock signals CLK2 or CLK4, a drain terminal receiving a high level voltage as Vbias (a bias voltage), and a source terminal connected to the X node and a drain terminal of the TFT T9. The TFT 9 has a gate terminal connected to the P node, the drain terminal connected to the X node and the source terminal of the TFT T5, and a source terminal connected to a low level voltage terminal having a low level voltage as VGL.

To improve the off-characteristics, the conventional inverter unit uses four TFTs and needs a LVGL signal in addition to the VGL signal. However, the inverter unit 20 in the present exemplary embodiment of the invention controls the TFT T5 to be driven by the clock signal, and therefore two TFTs are enough to achieve desired characteristics without the LVGL signal. Accordingly, the inverter unit 20 in this exemplary embodiment of the invention is very useful as compared with the conventional one.

The reset unit 30 periodically resets the P node with the second clock signals CLK2 or CLK4.

The reset unit 30 includes a TFT 7. The TFT 7 has a gate terminal receiving the second clock signals CLK2 or CLK4, a drain terminal connected to the P node, and a source terminal connected to the low level voltage as VGL.

The output unit 40 is connected to the P node, the X node and corresponding gate line. The output unit 40 includes a pull-up unit for outputting a signal of the P node as a pull-up output signal in sync with the first clock signals CLK1 or CLK3 to corresponding gate line, and a pull-down unit for outputting a pull-down output signal based on a signal of the X node to corresponding gate line.

The pull-up unit includes a TFT T3. The TFT T3 has a gate terminal connected to the P node, a drain terminal receiving the first clock signals CLK1 or CLK3, and a source terminal connected to the output terminal N Gout connecting with the P node.

The pull-down unit includes TFTs T2 and T4. The TFT T2 has a gate terminal connected to the X node, a drain terminal connected to the P node, and a source terminal connected to the low level voltage terminal VGL. The TFT T4 has a gate terminal connected to both the gate of the TFT T2 and the X node, a drain terminal connected to the output terminal N Gout, and a source terminal connected to the low level voltage terminal VGL. Meanwhile, the TFTs T2 and T4 may also be called a stabilization device for continuously maintaining the voltage levels of the P node and the output terminal N Gout as the level of the low level voltage VGL after outputting a pull-up output signal to corresponding gate line.

A capacitor C1 is provided for boosting and stabilizes the off-level characteristics of the output signal from the output terminal N Gout. The capacitor C1 is connected between the gate and source of the TFT T3.

In FIG. 4, CLK1 precedes CLK2 by 1 H, CLK2 precedes CLK3 by 1 H, CLK3 precedes CLK4 by 1 H and CLK4 precedes CLK1 by 1 H. Here, 1 H refers to a pulse width of the clock signal, and is calculated as one frame time (=1/frequency)/the number of gate lines.

Thus, each clock signal is supplied to a high level once per 4 H period, so that the voltage level of the X node can increase through the TFT T5 once per 4 H period. Thus, the X node can keep a high level higher than the conventional high level for time of one frame. This means that the X node can keep a high voltage more exactly than that of the conventional case. Also, the P node is reset through the TFT T7 once per 4 H period, and it is thus advantageous to stabilize the shift register.

With this configuration, the shift register according to an exemplary embodiment of the invention operates as follows.

In the case of a forward driving, the output signal from the (N−2)th shift register is applied to the gate of the TFT T1 of the input unit 60, and the forward input signal FW is applied to the drain of the TFT T1. After that, the output signal from the (N+2)th shift register is applied to the gate of the TFT T10 of the input unit 60, and the backward input signal BW is applied to the drain of the TFT T10.

A backward driving is a contrast to the forward driving. That is, the output signal from the (N+2)th shift register is applied to the gate of the TFT T10 of the input unit 60, and the forward input signal FW is applied to the drain of the TFT T10. After that, the output signal from the (N−2)th shift register is applied to the gate of the TFT T1 of the input unit 60, and the backward input signal BW is applied to the drain of the TFT T1.

Accordingly, in the case of the forward driving, the TFT T1 operates as an input TFT, and the TFT T10 operates as an additional reset TFT separately from the TFT T7. In the case of the backward driving, the TFT T10 operates as the input TFT, and the TFT T1 operates as the reset TFT. Thus, the P node has a voltage level of VGH-a obtained by subtracting a threshold voltage of the TFT T1 or T10 from VGH. The capacitor C1 is charged. The TFT T9 becomes turned on and the X node has a voltage level of VGL. The TFTs T2 and T4 become turned off since the X node has a low level. In this state, the P node maintains a floating state while keeping the voltage level. Therefore, the TFT T3 is turned on and maintains the same state for the same time as the P node, thereby outputting the clock signals CLK1 or CLK3 as the output signal of N Gout to corresponding gate line.

Then, the clock signal CLK2 or CLK4 having a high level is applied to the TFTs T7 and T5, and thus the TFTs T7 and T5 are turned on. As the TFT T5 is turned on, the X node becomes a high level voltage Vbias. As the TFT T7 is turned on, the P node is dropped into a level of VGL.

If the X node has the high level voltage, the TFTs T2 and T4 are turned on and the P node and the output signal of N Gout maintain the low level voltage.

The foregoing operations of the shift register according to the present exemplary embodiment will be described in more detail with reference to the timing diagrams of FIGS. 5, 6, 7 and 8.

Figure 5:
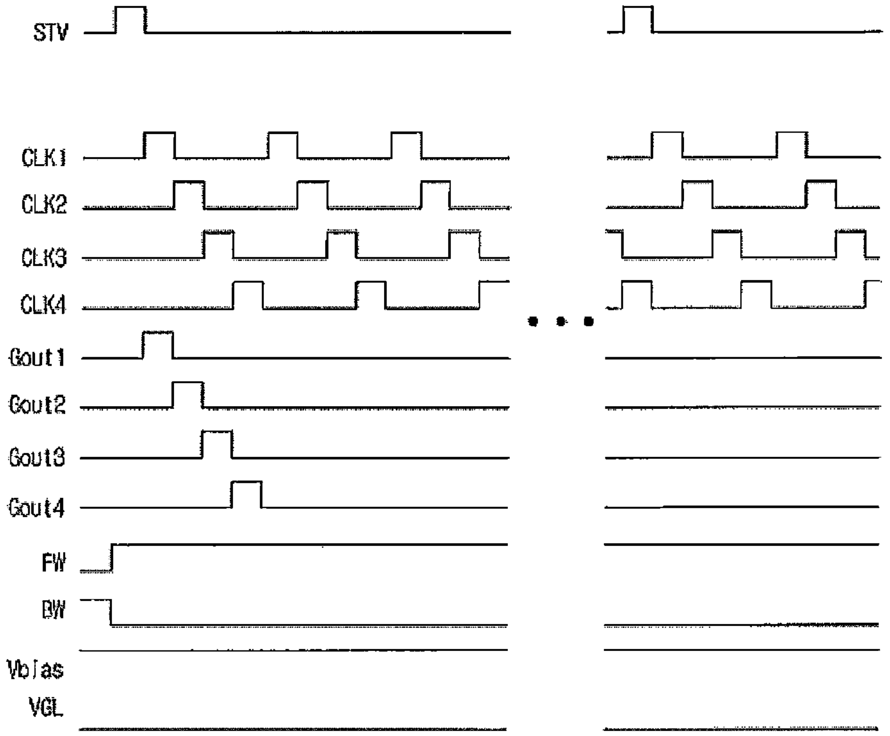
FIG. 5 is a forward timing diagram of when the gate driving circuit employing the shift register is provided as a single type according to the invention.
Figure 6:
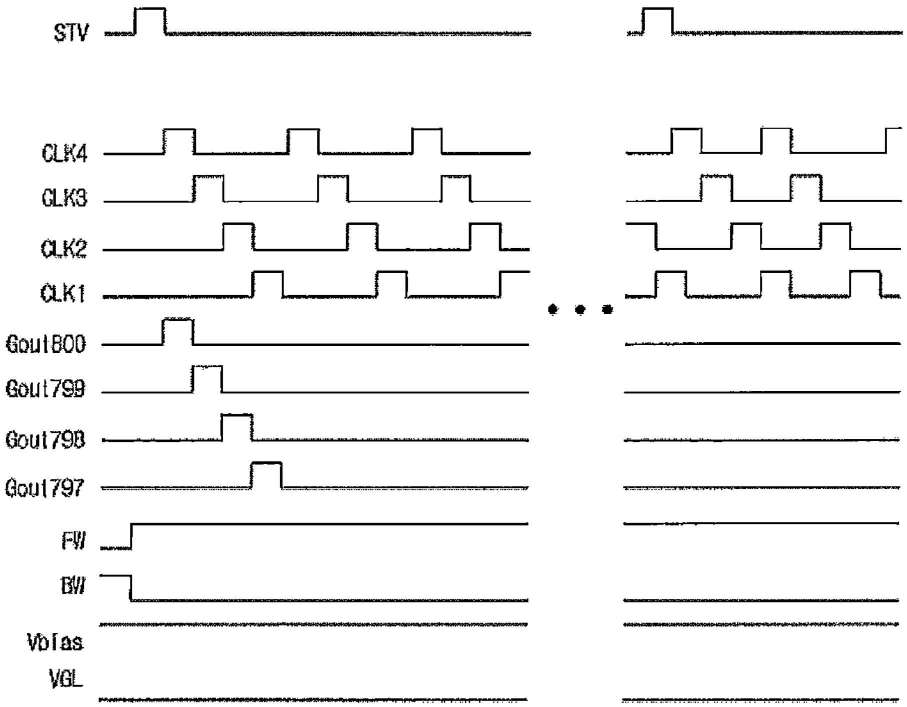
FIG. 6 is a backward timing diagram of when the gate driving circuit employing the shift register is provided as a single type according to the invention.

FIG. 5 is a forward timing diagram of the single type. And FIG. 6 is a backward timing diagram.

Figure 9:
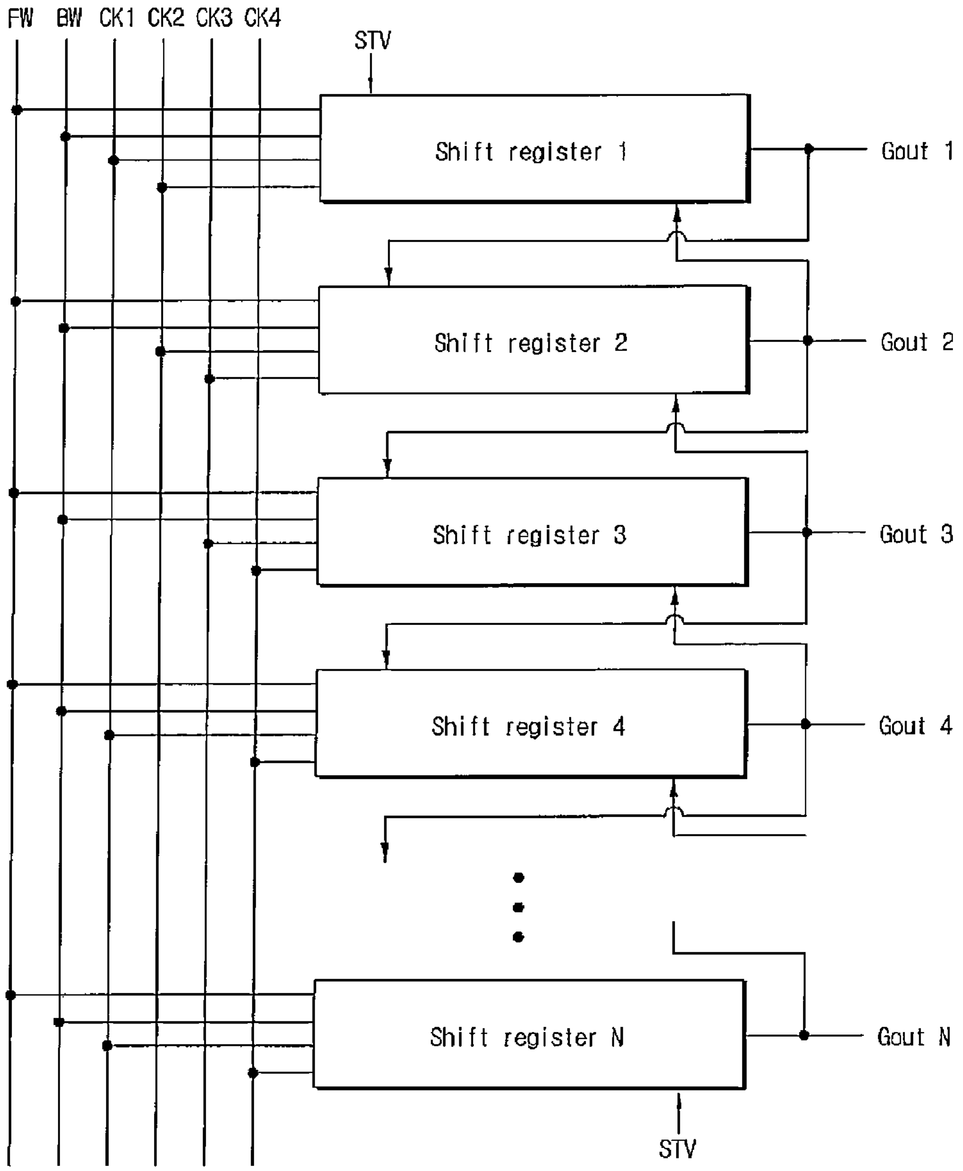
FIG. 9 is a block diagram of a single type gate driving circuit employing a shift register according to an exemplary embodiment of the invention.

In the case of the single type, as shown in FIG. 9, there are needed four clock signals at one side of the display panel.

The odd-numbered shift register uses the clock signals CLK1 and CLK3 as the output signals and the clock signals CLK2 and CLK4 for the reset, and the even-numbered shift register uses the clock signals CLK2 and CLK4 as the output signals and the clock signals CLK3 and CLK1 for the reset. Thus, the single type uses four clock signals for the bidirectional driving.

In the forward driving as shown in FIG. 5, the output signals Gout 1, Gout 2, Gout 3 and Gout 4 are output in order of the first to last gate lines on the basis of the clock signals CLK1, CLK2, CLK3 and CLK4 sequentially input after a start signal STV.

In the backward driving as shown in FIG. 6, the clock signals CLK3, CLK2 and CLK1 are sequentially received with the clock signal CLK4 at the head after the start signal STV. Thus, the gate driving circuit outputs the out signals Gout 800, Gout 799, Gout 798 and Gout 797 in order of the last to first gate lines.

Figure 7:
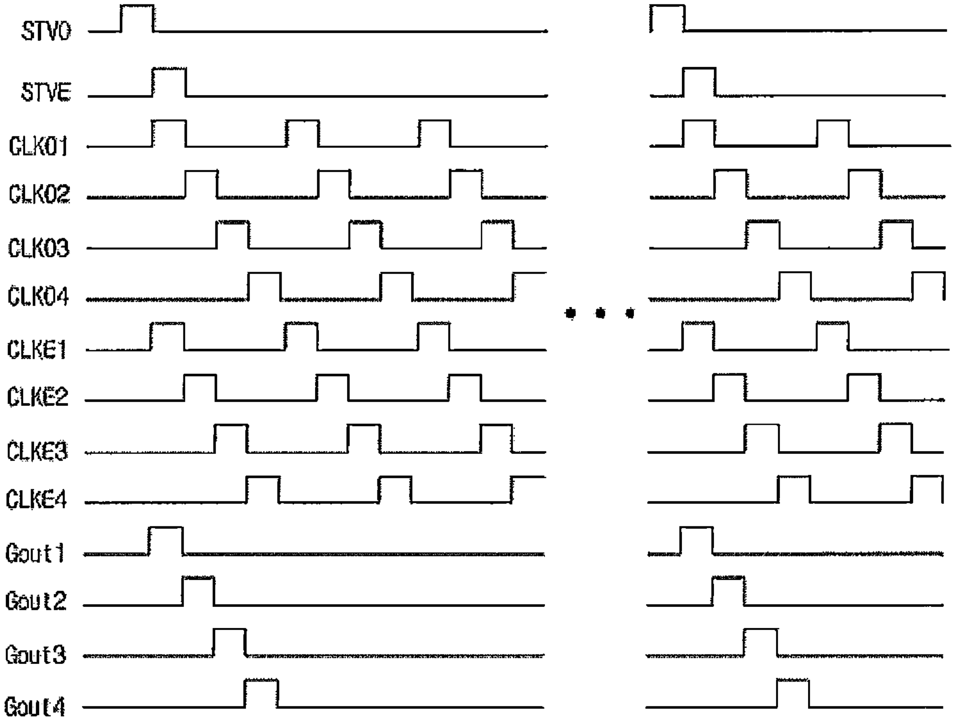
FIG. 7 is a forward timing diagram of when the gate driving circuit employing the shift register is provided as a dual type according to the invention.
Figure 8:
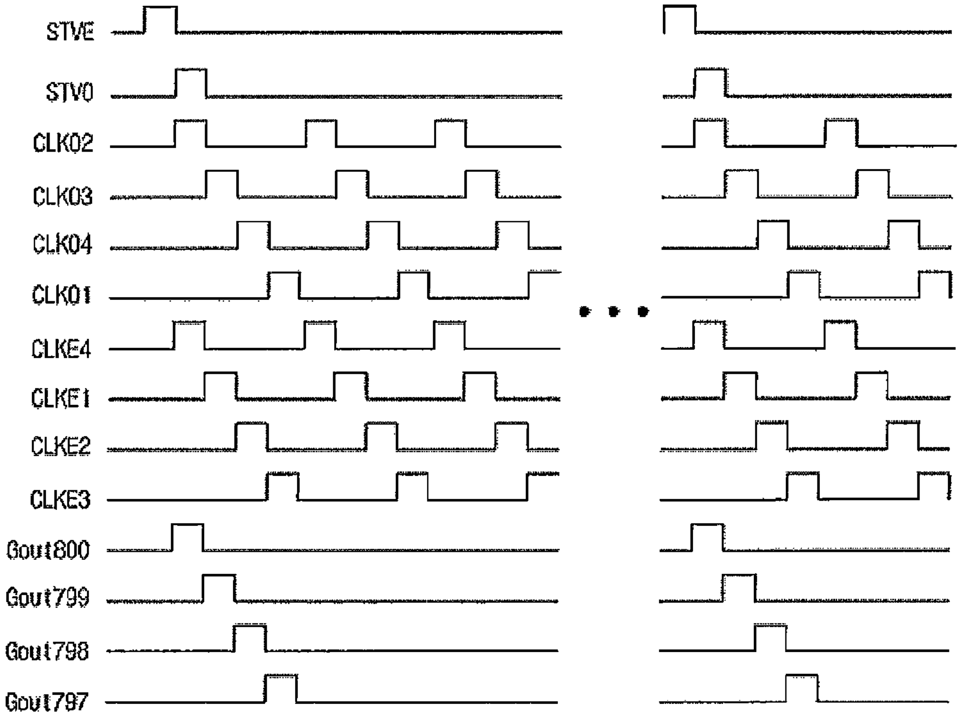
FIG. 8 is a backward timing diagram of when the gate driving circuit employing the shift register is provided as a dual type according to the invention.

FIG. 7 is a forward timing diagram of the dual type. And FIG. 8 is a backward timing diagram of the dual type.

Figure 10:
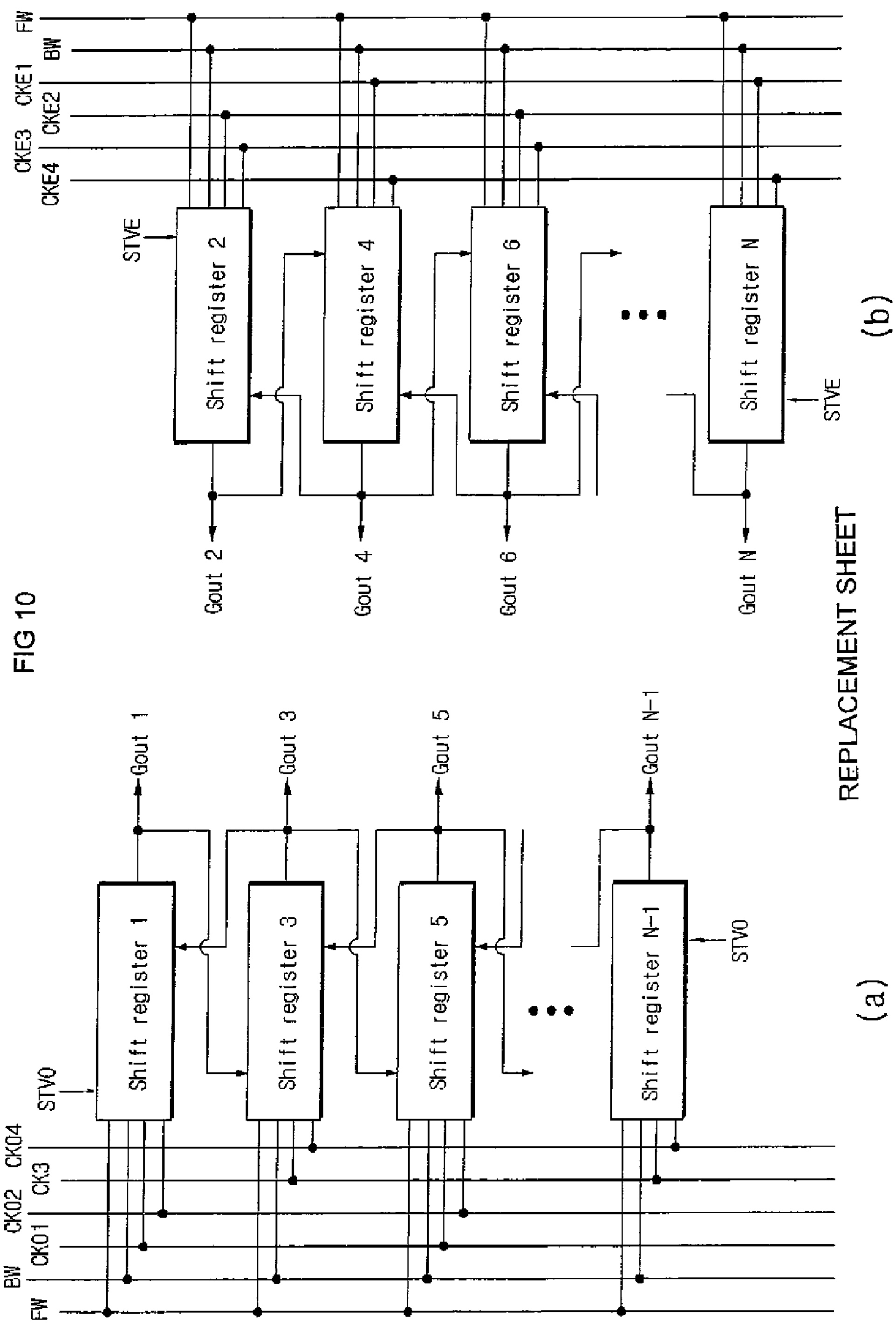
FIG. 10 is a block diagram of a dual type gate driving circuit employing a shift register according to an exemplary embodiment of the invention.

In the case of the dual type, as shown in FIG. 10, each of the opposite sides of the display panel needs four clock signals. That is, if the clock is used for the inverting and the resetting, each of the odd-numbered and even-numbered shift registers needs four clock signals CLK, which do not overlap with each other, for the bidirectional driving. For instance, in the case of the dual type, the shift registers on the left of the display panel uses the clock signals CLKO1 and CLKO3 as the output signals, and the clock signals CLKO2 and the CLKO4 for the reset. Meanwhile, the shift registers on the right of the display panel uses the clock signals CLKE2 and CLKE4 for the output signals and the clock signals CLKE3 and CLKE1 for the reset.

To prevent the input timing and the reset timing from overlapping each other, each of the shift registers formed on the opposite sides of the display panel has to use four clock signals different in a period of 1 H or more. For example, in the case of the dual type, each of the shift registers provided on the opposite sides of the display panel needs four clock signals because the order of clocks has an effect on the forward or backward driving.

Figure 11:
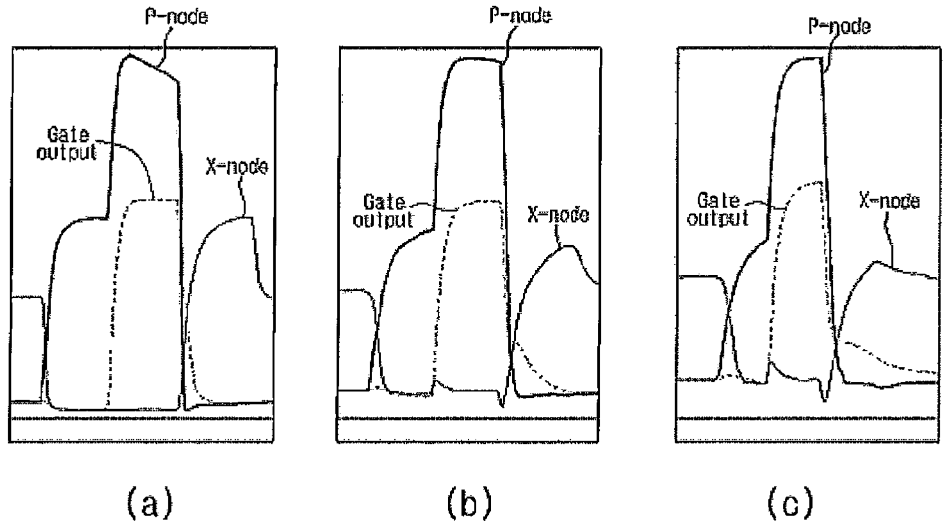
FIG. 11 is a graph showing a simulation result of a P-node, an X-node and an output waveform in the single-type gate driving circuit employing the shift register according to an exemplary embodiment of the invention.
Figure 12:
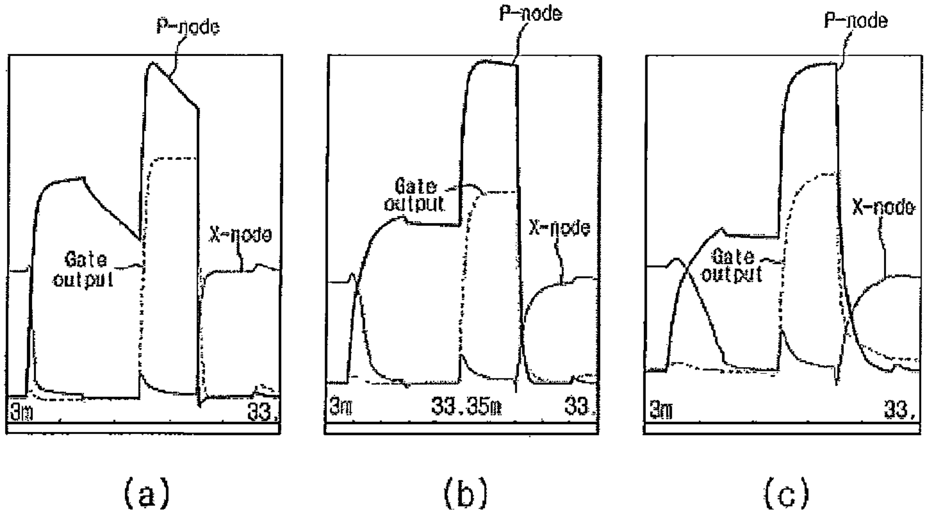
FIG. 12 is a graph showing a simulation result of a P-node, an X-node and an output waveform in the dual-type gate driving circuit employing the shift register according to an exemplary embodiment of the invention.

FIG. 11 is a graph showing a simulation result of a P-node, an X-node and an output waveform in the single-type gate driving circuit employing the shift register of FIG. 4. FIG. 12 is a graph showing a simulation result of a P-node, an X-node and an output waveform in the dual-type gate driving circuit employing the shift register of FIG. 4.

In FIG. 11, (a) shows a spice simulation result of the single-type gate driving circuit at a high temperature of about 60° C. and a humidity of about 90%, (b) shows a spice simulation result of the single-type gate driving circuit at a room temperature (e.g., about 25 to 27° C., and (c) shows a spice simulation result of the single-type gate driving circuit at a low temperature of about −20° C.

In FIG. 12, (a) shows a spice simulation result of the dual-type gate driving circuit at a high temperature of about 60° C. and a humidity of about 90%, (b) shows a spice simulation result of the dual-type gate driving circuit at a room temperature (e.g., about 25 to 27° C., and (c) shows a spice simulation result of the dual-type gate driving circuit at a low temperature of about −20° C.

Referring to FIGS. 11 and 12, in each case, the P node and the X node have normal signal waveforms, and the gate output waveforms are also stable.

Figure 13:
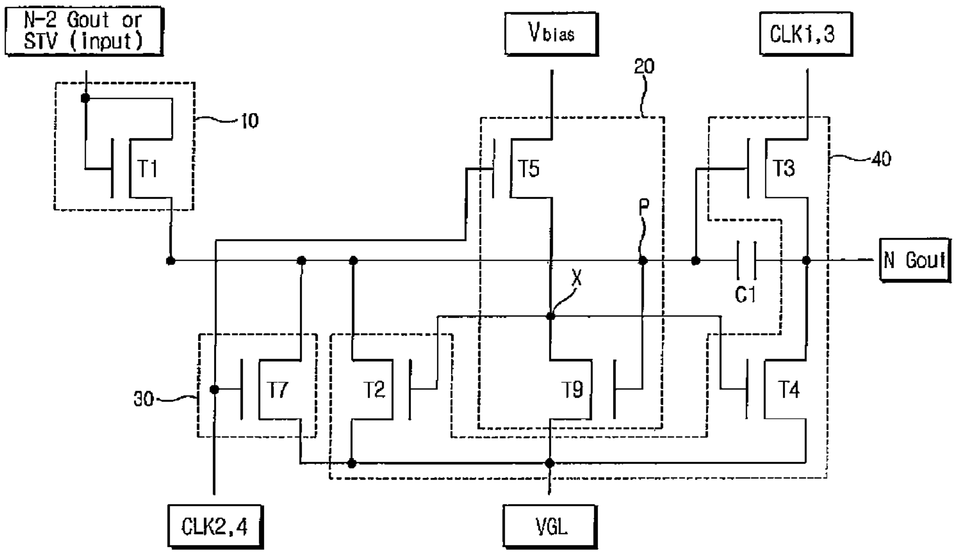
FIG. 13 is a circuit diagram of a shift register according to another exemplary embodiment of the invention.

FIG. 13 is a circuit diagram of a shift register according to another exemplary embodiment.

The shift register according to this exemplary embodiment does not include the input unit for bidirectional input provided in the shift register of FIG. 4. According to this exemplary embodiment, unidirectional driving, e.g., sequential driving in only one designated direction (forward or backward direction) is performed. The shift register in this exemplary embodiment includes an input unit 10, an inverter unit 20, a reset unit 30 and an output unit 40.

For the unidirectional driving, the input unit 10 receives an output signal from a previous shift register (generally the (N−2)th output N−2 Gout is a output signal that applied to the (N−2)th gate line) or a start signal STV (input) as a input signal, and transmits it to the P node (also called a 'bootstrap node).

The input unit 10 includes a TFT T1. The TFT T1 has a gate terminal and a drain terminal connected in common to the output terminal of the previous shift register. The TFT T1 has a source terminal connected to the P node.

The inverter unit 20, the reset unit 30 and the output unit 40 of FIG. 13 are the same as those of FIG. 4 and thus indicated by the same reference numerals. Accordingly, repetitive descriptions thereof will be avoided.

With this configuration, the shift register according to this exemplary embodiment operates as follows. Hereinafter, the following descriptions are achieved on the assumption that the shift register of FIG. 13 is employed in the dual-type gate driving circuit.

A pulse type input start signal STV (input) or an output signal N−2 Gout of a previous (e.g., (n−2)th) shift register (not shown) is input through a gate terminal of the TFT T1. Then, the TFT T1 becomes turned on, and the P node has a positive level. In this case, the P node has a voltage level of VGH-a obtained by subtracting the threshold voltage of the TFT T1 from VGH.

Meanwhile, the X node is dropped into a voltage level of VGL by the TFT T9 turned on as the voltage of the P node increases. Also, the output signal N Gout maintains a low level since the TFT T3 is turned on as the voltage of the P node increases but the clock signal maintains VGL. While receiving the input through the TFT T1, the capacitor C1 is charged.

Then, the input signal (e.g., N−2 Gout) becomes a signal having the low level VGL, and the TFT T1 becomes turned off. In this case, the P node enters a floating state, and maintains the floating state until receiving a reset signal. Accordingly, the TFT T3 is turned on by the high level voltage of the P node, and keeps the same state for the same time as the P node. When the clock signal CLK1 or CLK3 is applied, the P node is bootstrapped, and the TFT T3 outputs the clock signal at the same time.

After the clock signal CLK1 or CLK3, if the clock signal CLK2 or CLK4 is applied to the TFTs T7 and T5, the TFTs T7 and T5 are turned on. As the TFT T5 is turned on, the X node has a high level voltage Vbias. As the TFT T7 is turned on, the P node is dropped into a low level voltage as VGL. Like this, if the X node has the high level voltage Vbias, the TFTs T2 and T4 are turned on, thereby maintaining the P node to have the low level voltage.

In other words, the applied input signal causes the TFT T1 to be turned on and the P node to be precharged. If the clock signal CLK1 or CLK3 is applied to the TFT T3, the P node is bootstrapped so that the clock signal CLK1 or CLK3 can be output to the output terminal N Gout via the TFT T3.

Meanwhile, if the P node is bootstrapped, the TFT T9 is turned on. When the P node is bootstrapped, the clock signal CLK2 or CLK4 has a low level voltage (e.g., VGL). If the clock signal CLK2 or CLK4 has a low level voltage, the TFT T5 maintains an off state. As the TFT T9 is turned on, the X node is dropped into a low level voltage as VGL, and the TFTs T2 and T4 for stabilization or the like are turned off.

If the clock signal CLK2 or CLK4 is applied at a timing after the clock signal CLK1 or CLK3, the TFTs T7 and T5 are turned on. Thus, the P node is reset through the TFT T7, and the voltage level of the X node increases up to a level of Vbias−Vth through the TFT T5. As the voltage level of the X node increases, a gate bias of "the high level voltage of the X node" is applied to the gate terminals of the TFTs T2 and T4, so that the TFTs T2 and T4 are turned on.

Like this, each clock signal is supplied to a high level once per 4 H period, so that the voltage level of the X node can increase through the TFT T5 once per 4 H period. Thus, the X node can keep a high level higher than the conventional high level for time of one frame. This means that the X node can keep a high level voltage more exactly than that of the conventional case. Also, the P node is reset through the TFT T7 once per 4 H period, and it is thus advantageous to stabilize the shift register.

As described above, there is provided a shift register, in which not an output waveform of the next terminal but a clock signal is applied to a reset TFT, thereby reducing a load in an output. Also, a P node is reset at every 4 H, thereby improving off-characteristics.

Further, the clock signal is used for the reset, so that the conventional TFT for the reset can be omitted.

Furthermore, the clock signal is employed for the reset, and thus there is no need of a suicide dummy terminal for resetting the last terminal. Accordingly, the suicide dummy terminal can be removed, so that a panel can be designed with a more space to spare than the conventional panel.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A gate driving circuit comprising a plurality of shift registers sequentially connected and respectively supplied scan signals to a plurality of gate lines of a display device, each shift register comprising:

an input unit which outputs a forward or backward input signal to a first node by an output signal from a previous or subsequent shift register of the shift register;

an inverter unit which connects with the first node, generates an inverting signal for a signal of the first node, and outputs the inverting signal to a second node;

an output unit which comprises a pull-up unit for activating a first clock signal by the signal of the first node and outputting the first clock signal as an output signal to corresponding gate line, and a pull-down unit for activating and outputting a pull-down output signal to corresponding gate line by a signal of the second node; and a reset unit which periodically resets the first node by a second clock signal, wherein the inverter unit is controlled by the second clock signal.

2. The gate driving circuit according to claim 1, wherein the input unit comprises a first switching device which comprises a gate to receive an output signal of the previous shift register, a drain to receive the forward or backward input signal, and a source connecting with the first node; and a second switching device which comprises a gate to receive an output signal of the subsequent shift register, a drain to receive the forward or backward input signal, and a source connecting with the first node.

3. The gate driving circuit according to claim 2, wherein when the forward input signal is input to the first switching device by the output signal of the previous shift register, the backward input signal is input to the second switching device by the output signal of the subsequent shift register, and the first node is additionally reset by the backward input signal.

4. The gate driving circuit according to claim 2, wherein when the forward input signal is input to the second switching device by the output signal of the subsequent shift register, the backward input signal is input to the first switching device by the output signal of the previous shift register, and the first node is additionally reset by the backward input signal.

5. The gate driving circuit according to claim 3, wherein the forward input signal comprises a gate high voltage VGH, and the backward input signal comprises a gate low voltage VGL.

6. The gate driving circuit according to claim 1, wherein the inverter unit comprises:

a first switching device which comprises a gate to receive the second clock signal, a drain to receive a bias voltage, and a source connected to the second node; and a second switching device which comprises a gate connected to the first node, a drain connected to the second node, and a source connected to a low level voltage terminal.

7. The gate driving circuit according to claim 6, wherein the second clock signal is applied once per 4H period.

8. The gate driving circuit according to claim 1, wherein the reset unit comprises a switching device which comprises a gate to receive the second clock signal, a drain connected to the first node, and a source connected to a low level voltage terminal.

9. The gate driving circuit according to claim 8, wherein the second clock signal is applied once per 4 H period.

10. The gate driving circuit according to claim 1, wherein the first clock signal is a clock signal CLK1 or CLK3 and the second clock signal is a clock signal CLK2 or CLK4, and the four clock signals CLK1 to CLK4 are different in a phase of 1 H in cyclic sequence.

11. The gate driving circuit according to claim 4, wherein the forward input signal comprises a gate high voltage VGH, and the backward input signal comprises a gate low voltage VGL.

12. A shift register comprising a first switching device which comprises a gate connected to an output terminal of a previous shift register, a drain to receive a forward or backward input signal, and a source connected to a first node;

a second switching device which comprises a gate connected to an output terminal of a subsequent shift register, a drain to receive a forward or backward input signal, and a source connected to a first node;

a third switching device which comprises a gate connected to the first node, a drain to receive a first clock signal, and a source connected to an output terminal of the shift register;

a fourth switching device which comprises a gate connected to a second node, a drain connected to the output terminal of the shift, and a source connected to a low level voltage terminal;

a fifth switching device which comprises a gate connected to the gate of the fourth switching device and the second node, a drain connected to the first node, and a source connected to the low level voltage terminal;

a sixth switching device which comprises a gate to receive a second clock signal, a drain to receive a bias voltage, and a source connected to the second node;

a seventh switching device which comprises a gate connected to the first node, a drain connected to the second node and the source of the sixth switching device, and a source connected to the low level voltage terminal; and an eighth switching device which comprises a gate to receive the second clock signal, a drain connected to the first node, and a source connected to the low level voltage terminal.

13. The shift register according to claim 12, wherein first clock signal and the second clock signal are different in a phase of 1 H from each other.

14. The shift register according to claim 12, wherein when the forward input signal is input to the first switching device by the output signal of the previous shift register, the backward input signal is input to the second switching device by the output signal of the subsequent shift register, and the first node is additionally reset by the backward input signal.

15. The shift register according to claim 12, wherein when the forward input signal is input to the second switching device by the output signal of the subsequent shift register, the backward input signal is input to the first switching device by the output signal of the previous shift register, and the first node is additionally reset by the backward input signal.

16. The shift register according to claim 14, wherein the forward input signal comprises a gate high voltage VGH, and the backward input signal comprises a gate low voltage VGL.

17. The shift register according to claim 15, wherein the forward input signal comprises a gate high voltage VGH, and the backward input signal comprises a gate low voltage VGL.

* * * * *

UNITED STATES PATENT AND TRADEMARK OFFICE

CERTIFICATE OF CORRECTION

PATENT NO. : 8,774,346 B2
APPLICATION NO. : 13/597312
DATED : July 8, 2014
INVENTOR(S) : Ki Min Son It is certified that error appears in the above-identified patent and that said Letters Patent is hereby corrected as shown below:

In the Claims

Claim 12 (col. 12, l. 11)

"…terminal of the shift, and a source connected to a low…" should read --…terminal of the shift register, and a source connected to a low…--

Signed and Sealed this
Twenty-eighth Day of October, 2014

Michelle K. Lee
*Deputy Director of the United States Patent and Trademark Office*